United States Patent
Toda

(10) Patent No.: US 6,197,610 B1
(45) Date of Patent: Mar. 6, 2001

(54) METHOD OF MAKING SMALL GAPS FOR SMALL ELECTRICAL/MECHANICAL DEVICES

(75) Inventor: Risaku Toda, Plano, TX (US)

(73) Assignee: Ball Semiconductor, Inc., Allen, TX (US)

( * ) Notice: Subject to any disclaimer, the term of this patent is extended or adjusted under 35 U.S.C. 154(b) by 0 days.

(21) Appl. No.: 09/483,640

(22) Filed: Jan. 14, 2000

(51) Int. Cl.[7] ..................................................... H01L 21/00
(52) U.S. Cl. ................... 438/50; 438/48; 438/49; 257/254; 257/414; 257/415; 257/416; 257/417
(58) Field of Search ................... 438/50, 48–49; 257/254, 414–17

(56) References Cited

U.S. PATENT DOCUMENTS

| | | | |
|---|---|---|---|
| Re. 31,473 | 12/1983 | Kilby et al. | 425/6 |
| 5,278,097 | * 1/1994 | Hotchkiss et al. | 437/164 |
| 5,365,671 | * 11/1994 | Yaniger | 33/366 |
| 5,431,127 | * 7/1995 | Stevens et al. | 117/75 |
| 5,457,333 | * 10/1995 | Fukui | 257/253 |
| 5,462,639 | 10/1995 | Matthews et al. | 156/662.1 |
| 5,466,301 | * 11/1995 | Hammerbacher et al. | 136/246 |
| 5,726,480 | 3/1998 | Pister | 257/415 |
| 5,786,621 | * 7/1998 | Saif et al. | 257/415 |
| 5,845,730 | * 12/1998 | Thuen et al. | 180/282 |
| 5,955,776 | * 9/1999 | Ishikawa | 257/618 |
| 6,032,531 | * 3/2000 | Roszhart | 73/504.04 |
| 6,077,388 | * 6/2000 | Freeman | 156/345 |

FOREIGN PATENT DOCUMENTS 2-119241    10/1988   (JP).

* cited by examiner

*Primary Examiner*—Matthew Smith
*Assistant Examiner*—Granvill Lee
(74) *Attorney, Agent, or Firm*—Haynes and Boone, LLP

(57) ABSTRACT

A method and system for making small gaps in a MEMS device is disclosed. The MEMS device is first made with a sacrificial layer where the gap is to reside. The device can then be assembled, including forming a protective coat surrounding the device. Once the protective coat is formed, small holes in the protective coat can be made to expose the sacrificial layer to an external environment. The holes can be formed using laser ablation. After the small holes have been made, an etchant can then be applied through the holes to remove the sacrificial layer.

13 Claims, 3 Drawing Sheets

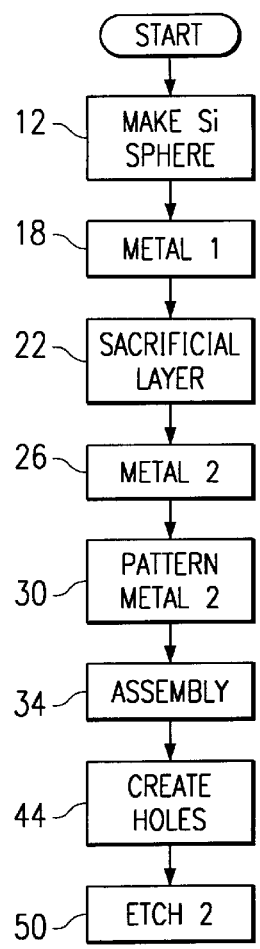
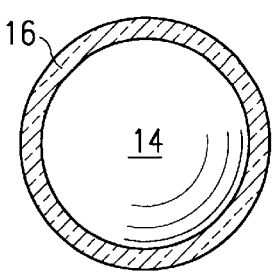
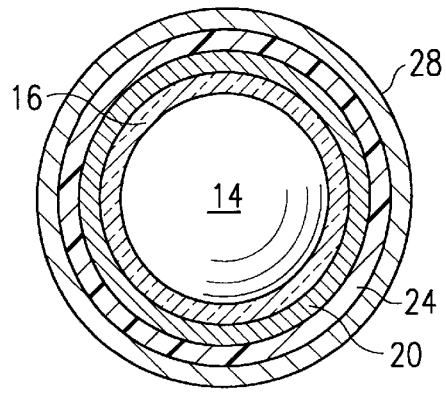
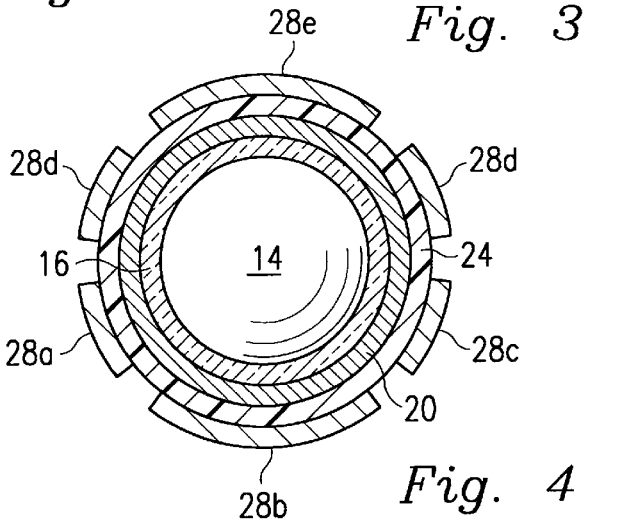
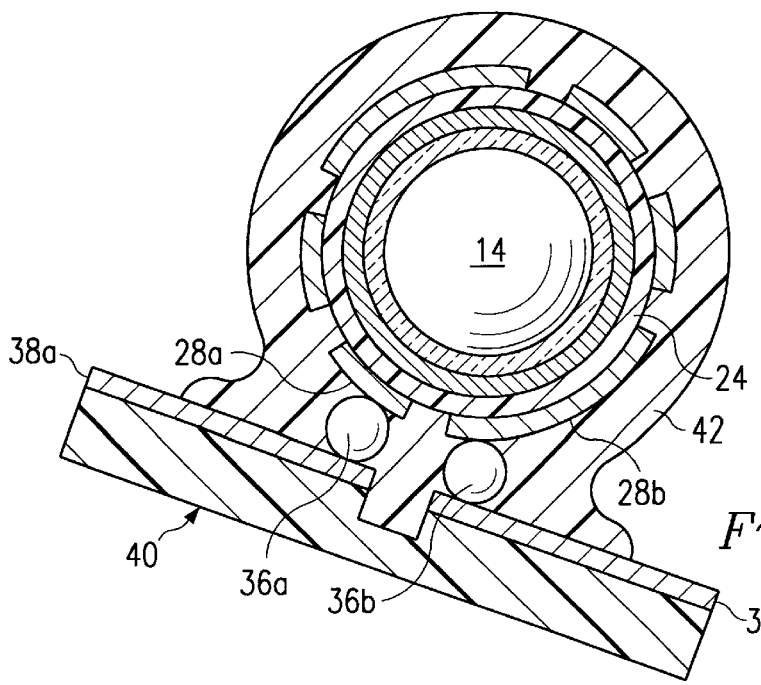

METHOD OF MAKING SMALL GAPS FOR SMALL ELECTRICAL/MECHANICAL DEVICES

BACKGROUND OF THE INVENTION

The invention relates generally to semiconductor processing, and in one embodiment, to a method for making small gaps for micro electromechanical systems (MEMS) devices, or small electrical/mechanical devices.

Many different integrated circuit devices sometimes require one or more small gaps placed within the circuit. For example, MEMS devices and other small electrical/mechanical devices may incorporate a gap in the device to allow the device to respond to mechanical stimuli. One common MEMS device is a sensor, such as an accelerometer, for detecting external force, acceleration or the like by electrostatically or magnetically floating a portion of the device. The floating portion can then move responsive to the acceleration and the device can detect the movement accordingly. In some cases, the device has a micro spherical body referred to as a core, and a surrounding portion referred to as a shell. Electrodes in the shell serve not only to levitate the core by generating an electric or magnetic field, but to detect movement of the core within the shell by measuring changes in capacitance and/or direct contact of the core to the shell.

Conventionally, the core and the shell are separately made and assembled. Therefore, no appropriate method for making a MEMS device where the core and shell are precisely arranged in close vicinity with each other has been known.

In the field of semiconductor device production, many methods and techniques are known for making micro chips and forming microscopic circuit patterns in multiple-layers. These methods include, for example, lithography, etching, chemical vapor deposition (CVD), electron beam exposure printing or the like. However, these methods can make plane boards or chips, but cannot make a micro spherical body and micro electrodes which are disposed in close vicinity to the micro spherical body.

In U.S. Pat. No. 5,955,776, assigned to the same assignee as the present application and hereby incorporated by reference as if reproduced in its entirety, a method and system for manufacturing spherical-shaped semiconductor integrated circuits is disclosed. A manufacturing process disclosed in the aforementioned patent is used to create and process semiconductor spheres, such as may be used for spherical-shaped semiconductor integrated circuits.

SUMMARY OF THE INVENTION

The present invention provides a method for making small gaps in MEMS devices. In one embodiment, the MEMS device is first made with a sacrificial layer where the gap is to reside. The device can then be assembled, including forming a protective coat surrounding the device. Once the protective coat is formed, small holes in the protective coat can be made to expose the sacrificial layer to an external environment. After the small holes have been made, an etchant can then be applied through the holes to remove the sacrificial layer.

In some embodiments, the holes are formed using laser ablation.

In some embodiments, one or more solder bumps are assembled to the device and a substrate before the sacrificial layer is removed.

In some embodiments, the protective coat is also formed around the solder bumps and around the substrate.

In some embodiments, the etchant is a dry etchant that can flow easily through the holes.

In some embodiments, the device is built around a spherical shaped substrate. The device can also be built around a flat substrate.

BRIEF DESCRIPTION OF THE DRAWINGS

FIG. 1 is a flowchart of a manufacturing process for implementing one embodiment of the present invention.

FIGS. 2–5, 6a, 6b, 7a, and 7b are cross sectional views of a spherical shaped accelerometer being manufactured by the process of FIG. 1.

DESCRIPTION OF THE EMBODIMENTS

Figure 6A:
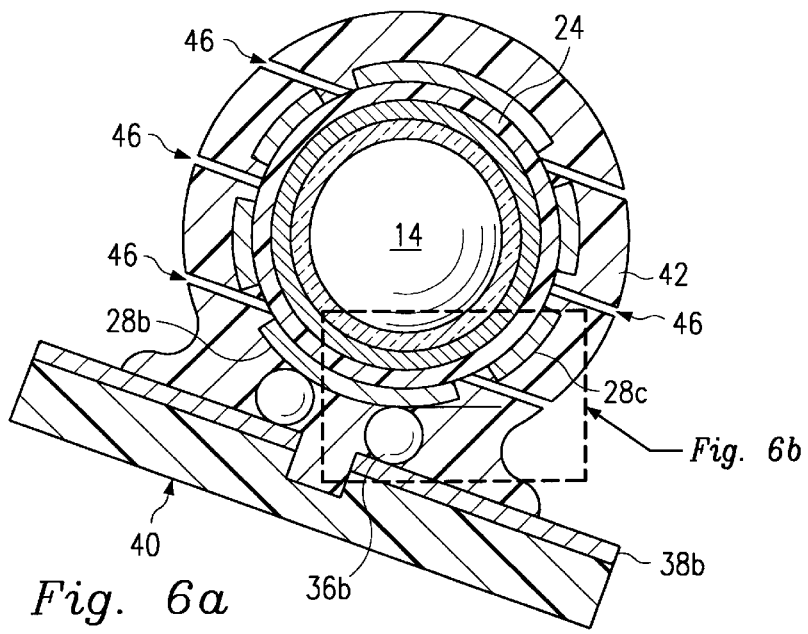

Referring to FIG. 1, the reference numeral 10 refers, in general, to a manufacturing process for making MEMS devices. It is understood that the present disclosure provides many different embodiments, or examples, for implementing different features on substantially spherical devices. Techniques and requirements that are only specific to certain embodiments or certain shaped devices should not be imported into other embodiments or devices. Also, specific examples of process steps, materials, and components are described below to clarify the present disclosure. These are, of course, merely examples and are not intended to limit the invention from that described in the claims.

For the sake of example, FIGS. 2–7b will illustrate a spherical shaped accelerometer that is being made by the manufacturing process 10. It is understood, however, that other MEMS devices can benefit from the process. For example, clinometers, ink-jet printer cartridges, and gyroscopes may be realized by utilizing a similar design.

At step 12 of the manufacturing process 10, a substrate is created. The substrate may be flat, spherical or any other shape. Referring also to FIG. 2, for the sake of example, a spherical substrate (hereinafter "sphere") 14 will be discussed. The sphere 14 is one that may be produced according to presently incorporated U.S. Pat. No. 5,955,776 and to continue with the present example, is made of silicon crystal. On an outer surface 16 of the sphere 14 is a silicon dioxide ($SiO_2$) layer. It is understood that the presence of the $SiO_2$ layer 16 is a design choice and may not be used in certain embodiments.

At step 18 of FIG. 1, a first group of processing operations are performed on the substrate. This first group of processing operations represents any operations that may occur before a sacrificial layer is applied (described below, with respect to step 22). Referring also to FIG. 3, in continuance with the example, a first metal layer 20 (hereinafter "metal 1") is deposited on top of the $SiO_2$ layer 16. The metal 1 layer 20 may be a copper-titanium nitride (Cu/TiN) material, although other materials may be used. This metal deposition may be created by several different methods, such as is described in U.S. patent Ser. No. 09/069,654 assigned to the same assignee as the present application and hereby incorporated by reference as if reproduced in its entirety.

At step 22 of FIG. 1, a sacrificial layer is applied to the substrate. The sacrificial layer may be applied on top of the previous layers (if any). In continuance with the example of FIG. 3, a sacrificial polysilicon layer 24 is applied on top of the metal 1 layer 20. The sacrificial layer 24 may be applied in any conventional manner, such as is described in the presently incorporated patents. Polysilicon is chosen because it reacts well with an etchant discussed below with respect to step 50, but it is understood that other materials can also be used.

At step 26 of FIG. 1, a second group of processing operations is performed on the substrate. This second group of processing operations represents any operations that may occur after the sacrificial layer is applied. In continuance with the example of FIG. 3, a second metal layer 28 (hereinafter "metal 2") is deposited on top of the sacrificial layer 24. The metal 2 layer 28 may also be Cu/TiN, although other materials may be used and the metal 2 layer may have a different composition than the metal 1 layer 20.

At step 30 of FIG. 1, one or more layers of material applied in the second group of processing operations are patterned. The patterning occurs before the removal of the sacrificial layer (described below, with respect to step 50). Referring also to FIG. 4, the metal 2 layer 28 is patterned to produce a plurality of electrodes 28a, 28b, 28c, and 28d.

The metal 2 layer 28 can be patterned by several different methods. For example, a resist coating may be applied to the metal 2 layer 28, such as is shown in U.S. patent Ser. No. 09/351,202 and/or U.S. patent Ser. No. 60/137,014 which are both assigned to the same assignee as the present application and hereby incorporated by reference as if reproduced in their entirety.

Once the resist coating has been applied, the coating may be exposed using a conventional photolithography process. In the present embodiment, the etching should not remove the sacrificial layer 24. For example, photolithography processes, such as shown in U.S. patent Ser. No. 09/350,815 and/or U.S. patent Ser. No. 09/348,369 which are both assigned to the same assignee as the present application and hereby incorporated by reference as if reproduced in their entirety, may be used. In the present example, the metal 2 layer 28 is the only layer that is patterned. For this reason, there is no need for alignment. It is understood, however, that different embodiments may indeed require alignment. For example, if the sphere 14 is flat, or if the metal 1 layer 20 is also patterned, the metal 2 layer 28 may indeed need to be patterned. Also, if the entire resist coating cannot be exposed at the same time, alignment between exposures may be required.

Once the resist coating has been fully exposed (to the extent required), the exposed surface can be developed and etched according to conventional techniques. For example, the exposed photo resist and Cu/TiN metal 2 layer may be etched according to a technique such as shown in U.S. patent Ser. No. 09/350,045 assigned to the same assignee as the present application and hereby incorporated by reference as if reproduced in its entirety. Once etching is complete (and cleaning, if required), the electrodes 28a, 28b, 28c, and 28d may be fully processed.

At step 34 of FIG. 1, the substrate and processed layers are assembled, as required by a particular application. Referring also to FIG. 5, a plurality of solder bumps 36a, 36b are applied to the electrodes 28a, 28b, respectively. The solder bumps 36a, 36b may also be applied to electrodes 38a, 38b, respectively of a second substrate 40. Because the sacrificial layer 24 still exists, the process of applying the solder bumps 36a, 36b to the electrodes 28a, 28b and 38a, 38b is relatively straight forward. For the sake of example, the solder bump application may be performed by the method described in U.S. patent Ser. No. 09/350,041 assigned to the same assignee as the present application and hereby incorporated by reference as if reproduced in its entirety.

Once the solder bumps have been applied and attached, a protective coating 42 may be applied. In the present example of FIG. 5, the protective coating 42 covers all of the electrodes 28a, 28b, 28c, 28d (and thus the underlying layers and substrates), the solder bumps 36a, 36b, and at least a portion of the electrodes 38a, 38b. The protective coating 42 may be epoxy resin, polyimide, or any other material. The protective coating 42 may be applied in any manner, including dipping or spraying the coating onto the components to be coated.

The above-described manufacturing process 10 uses conventional processing operations in a new and modified sequence. It is recognized that the processing operations referenced above, or different operations that better suit particular needs and requirements, may be used.

Figure 6B:
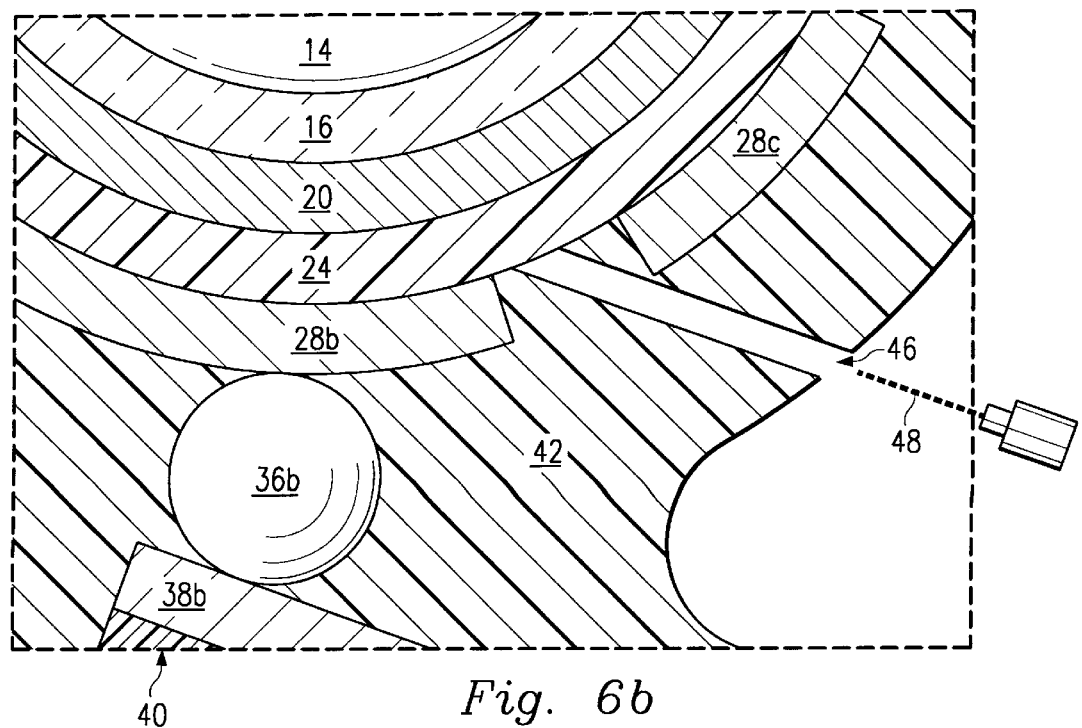

At step 44 of FIG. 1, holes are created in one or more of the processed layers. Referring also to FIGS. 6a and 6b, holes 46 are made through the protective coating 42 and extending between the electrodes 28a, 28b, 28c, 28d to the sacrificial layer 24. In the preferred embodiment, these holes are made using a laser 48. The laser 48 is positioned to burn the hole directly through the protective coating 42 to reach the sacrificial layer 24. Other ablation methods include particle injection or other chemical and/or mechanical techniques.

Figure 7A:
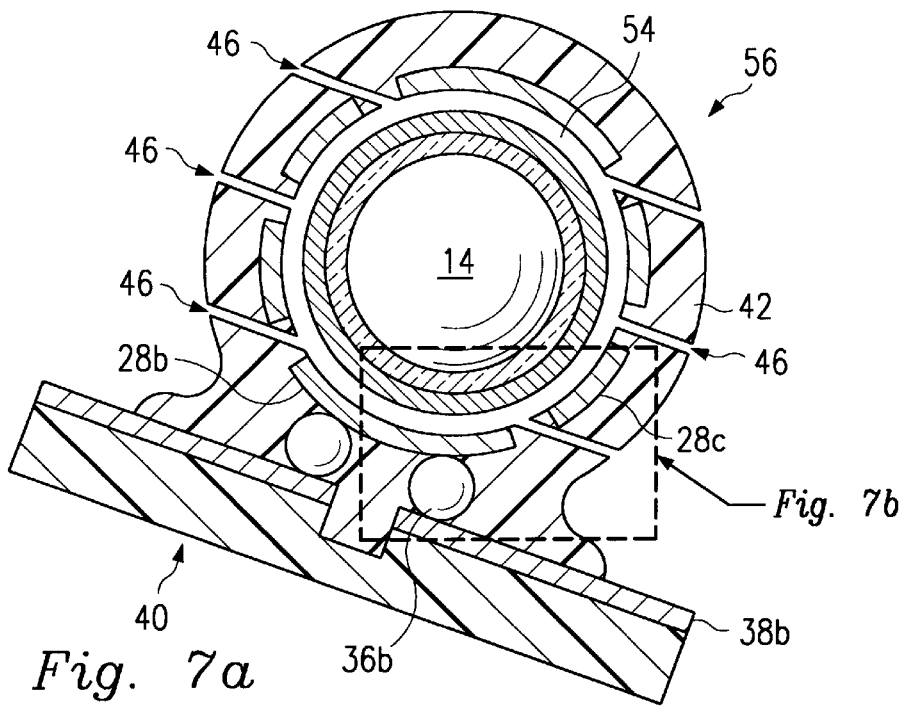
Figure 7B:
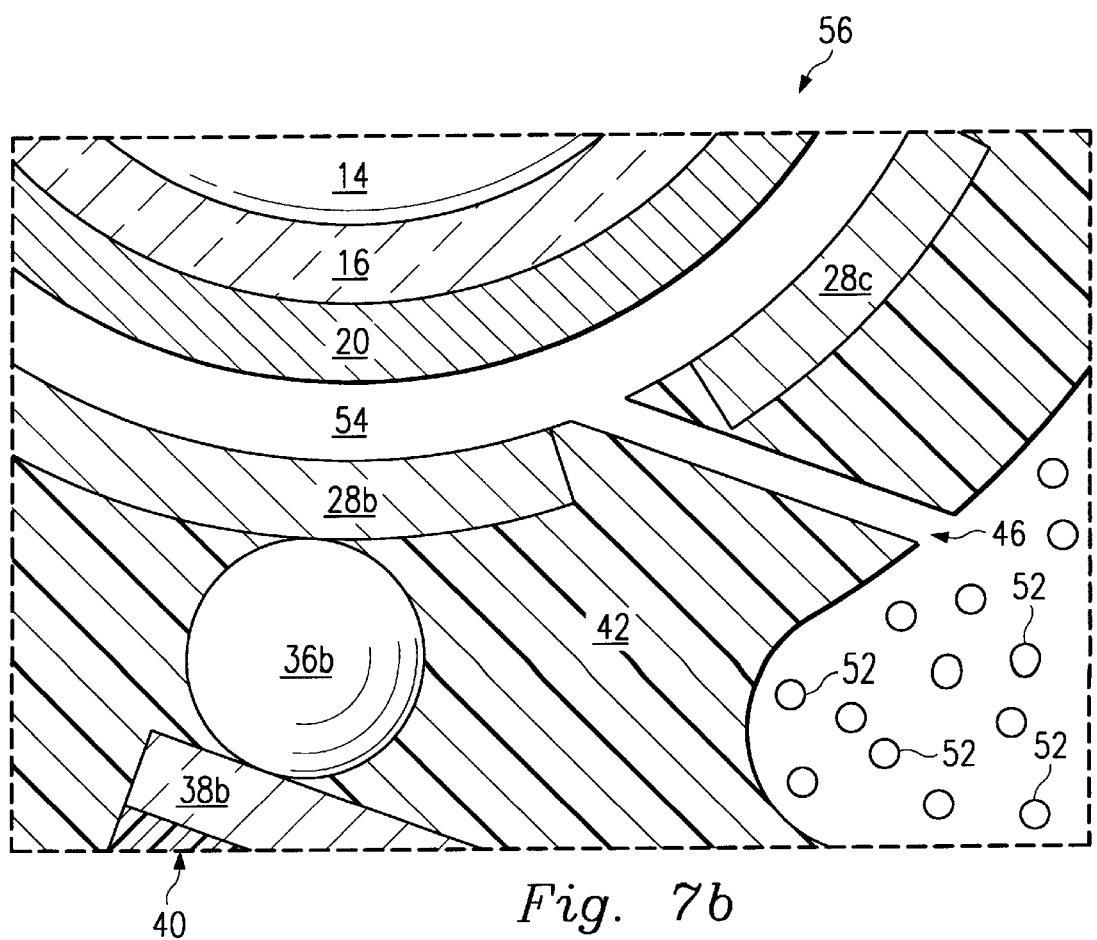

At step 50 of FIG. 1, the sacrificial layer is removed. Referring also to FIGS. 7a and 7b, the sacrificial layer 24 is etched through the holes 46. In continuance of the above examples where the sacrificial layer 24 is polysilicon, a xenon difluoride (XeF2) dry etchant 52 can be used. The XeF2 dry etchant 52 has extremely high selectivity to various materials, such as the polysilicon, but will not react with the metal 2 layer 28 or the protective coating 42. It is understood that other etchants may be used.

As a result, the sacrificial layer 24 is removed and a gap 54 is formed in its place. The gap 54 separates the sphere 14, SiO2 layer 16, and metal 1 layer 20 (collectively the "core") from the metal 2 layer 28 (the "shell"). In the present embodiment, the gap 54 extends around the entire core to complete the construction of a three-axis accelerometer 56.

Thus, there has been described and illustrated herein, a method for making small gaps for micro electromechanical systems (MEMS) devices, or small electrical/mechanical devices. It should be clearly understood, however, that various modifications, changes and substitutions are intended in the foregoing disclosure and in some instances some features of the invention will be employed without a corresponding use of other features. For example, the manufacturing process 10 of FIG. 1 can also work on other shaped substrates, such as flat two dimensional chips. Also, instead of solder bumps, a standard leadframe or other conventional system can be used. In some embodiments that utilize the standard leadframe, the protective coating 42 may not extend to the second substrate 40. Accordingly, it is appropriate that the appended claims be construed broadly and in a manner consistent with the scope of the invention.

What is claimed is:

1. A method for making a gap in a small electro/mechanical device, the method comprising the steps of:

making the device with a sacrificial layer where the gap is to reside;

assembling the device, including forming a protective coat surrounding the device;

forming one or more small holes in the protective coat that expose the sacrificial layer to an external environment; and applying an etchant through the small holes to remove the sacrificial layer;

wherein the step of applying the etchant is performed after the protective coat has been formed.

2. The method of claim 1 wherein the step of forming one or more small holes uses laser ablation.

3. The method of claim 1 wherein the step of assembling includes attaching one or more solder bumps to the device and a substrate, thereby electrically and mechanically connecting the device to the substrate.

4. The method of claim 3 wherein the protective coat is also formed around the solder bumps and around the substrate.

5. The method of claim 1 wherein the etchant is a dry etchant.

6. The method of claim 1 wherein the small electro/mechanical device is built around a spherical shaped substrate.

7. A method for making a MEMS device, comprising the steps of:

applying a first metal layer on a substrate;

forming a sacrificial layer on the first metal layer;

applying a second metal layer on the sacrificial layer, the second metal layer having a portion removed therefrom;

performing assembly;

forming a protective coat on the second metal layer;

forming a small hole extending through the protective coat, through the portion, and to the sacrificial layer; and applying an etchant through the small hole to remove the sacrificial layer;

wherein the step of applying the etchant is performed after the step of assembling.

8. The method of claim 7 wherein the step of forming the small hole uses laser ablation.

9. The method of claim 7 wherein the step of assembling includes attaching one or more solder bumps to the device and a substrate.

10. The method of claim 9 wherein the protective coat is also formed around the solder bumps and around the substrate.

11. The method of claim 7 wherein the etchant is a dry etchant.

12. The method of claim 7 wherein the substrate is relatively flat.

13. The method of claim 7 wherein the MEMS device is an accelerometer.

* * * * *